(12) United States Patent  
Cheng et al.

(10) Patent No.: US 8,736,049 B1  
(45) Date of Patent: May 27, 2014

(54) MICRO-PLASMA GENERATION USING MICRO-SPRINGS

(71) Applicant: Palo Alto Research Center Incorporated, Palo Alto, CA (US)

(72) Inventors: Bowen Cheng, Redwood City, CA (US); Dirk DeBruyker, San Jose, CA (US); Eugene M. Chow, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/802,633

(22) Filed: Mar. 13, 2013

(51) Int. Cl.
*H01L 23/34* (2006.01)
*F03H 1/00* (2006.01)

(52) U.S. Cl.
USPC ..... 257/713; 257/712; 313/359.1; 313/361.1; 313/326

(58) Field of Classification Search
USPC ............. 257/712, 713; 313/359.1, 361.1, 326
See application file for complete search history.

(56) References Cited

U.S. PATENT DOCUMENTS

| | | |
|---|---|---|
| 3,842,189 A | 10/1974 | Southgate |
| 5,613,861 A | 3/1997 | Smith et al. |
| 7,453,339 B2 | 11/2008 | Fork et al. |
| 2010/0116460 A1 | 5/2010 | Jewell-Larsen et al. |
| 2010/0116469 A1 | 5/2010 | Jewell-Larsen et al. |
| 2010/0155025 A1 | 6/2010 | Jewell-Larsen et al. |

OTHER PUBLICATIONS

Go, David B. "Ionic winds for locally enhanced cooling", Journal of Applied Physics 102, 053302 (2007), 9 pages.
Go, David B. et al. "Planar microscale ionization devices in atmospheric air with diamond-based electrodes", Plasma Sources Sci. Technol. 18 035004 (2009), 11 pages.
Jewell-Larsen, N. E. et al. "Electrohydrodynamic (EHD) Cooled Laptop", 25th IEEE Semi-Therm Symposium, 2009, 7 pages.

*Primary Examiner* — Evan Pert
(74) *Attorney, Agent, or Firm* — Bever, Hoffman & Harms, LLP; Patrick T. Bever

(57) ABSTRACT

Micro-plasma is generated at the tip of a micro-spring by applying a positive voltage to the spring's anchor portion and a negative voltage to an electrode maintained a fixed gap distance from the spring's tip portion. By generating a sufficiently large voltage potential (i.e., as determined by Peek's Law), current crowding at the tip portion of the micro-spring creates an electrical field that sufficiently ionizes neutral molecules in a portion of the air-filled region surrounding the tip portion to generate a micro-plasma event. Ionic wind air currents are generated by producing multiple micro-plasma events using micro-springs disposed in a pattern to produce a pressure differential that causes air movement over the micro-springs. Ionic wind cooling is produced by generating such ionic wind air currents, for example, in the gap region between an IC die and a base substrate disposed in a flip-chip arrangement.

20 Claims, 6 Drawing Sheets

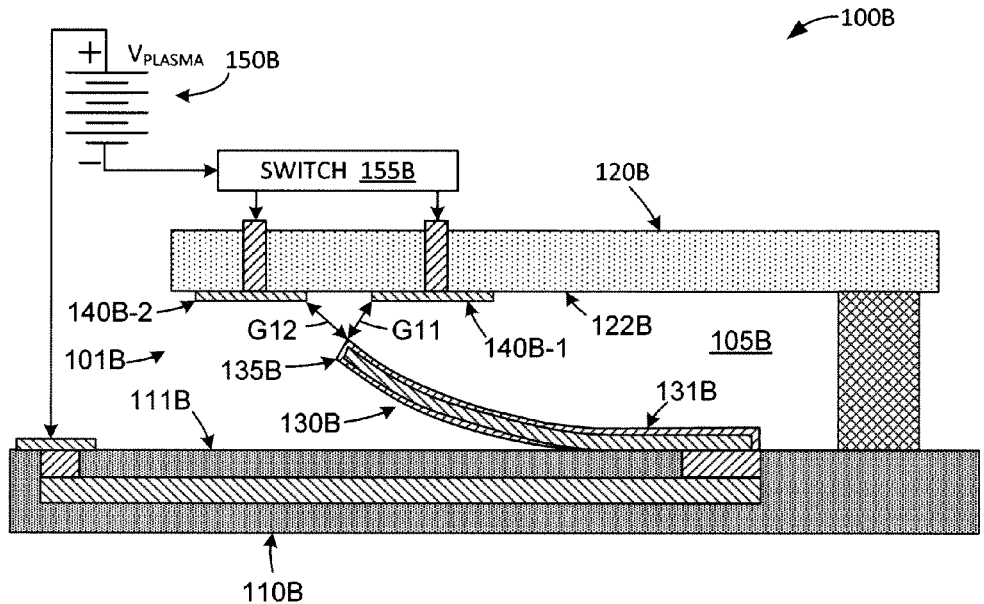
FIG. 3
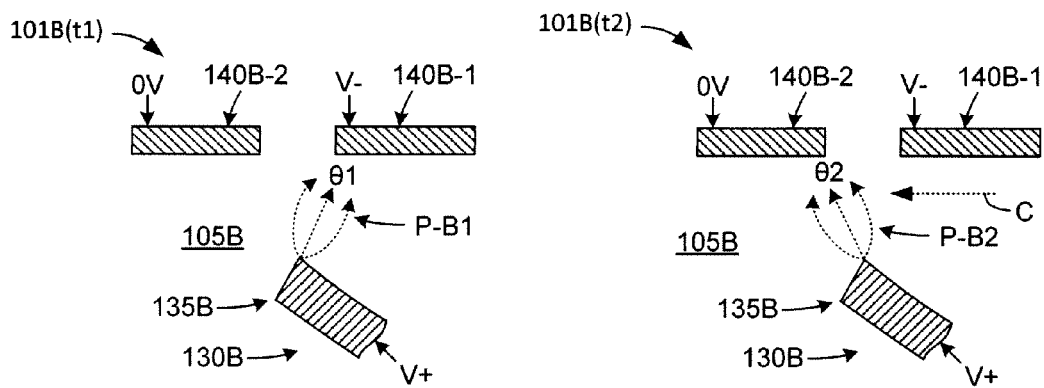
FIG. 4(A)            FIG. 4(B)

MICRO-PLASMA GENERATION USING MICRO-SPRINGS

FIELD OF THE INVENTION

This invention relates to methods for generating micro-plasma, and is particularly applicable to ionic wind-based cooling methods for integrated circuit die/substrate assemblies (e.g., semiconductor packages).

BACKGROUND OF THE INVENTION

A semiconductor package is a metal, plastic, glass, or ceramic casing containing one or more semiconductor electronic components typically referred to as integrated circuit (IC) die. Individual discrete IC components are formed using known semiconductor fabrication techniques (e.g., CMOS) on silicon wafers, the wafers are then cut (diced) to form individual IC die, and then the IC die are the assembled in a package (e.g., mounted on a package base substrate). The package provides protection against impact and corrosion, holds the contact pins or leads which are used to connect from external circuits to the device, and dissipates heat produced in the IC die.

Flip-chip packages are a type of semiconductor package in which two structures (e.g., an IC die and a package base substrate) are stacked face-to-face with interconnect structures (e.g., solder bumps or pins) disposed in an intervening gap to provide electrical connections between contact pads respectively formed on the two structures. The gap between the two structures ranges from microns to millimeters.

A micro-spring package is specific type of flip-chip semiconductor package in which electrical connections between the IC die and the package base substrate are provided by way of tiny curved spring metal fingers known as "micro-springs". Micro-springs are batch-fabricated on a host substrate (i.e., either the IC die or the package base substrate), for example, using stress-engineered thin films that are sputter-deposited with a built-in stress gradient, and then patterned to form individual flat micro-spring structures having narrow finger-like portions extending from associated base (anchor) portions. The narrow finger-like portions are then released from the host substrate (the anchor portion remains attached to the substrate), whereby the built-in stress causes the finger-like portions to bend (curl) out of the substrate plane with a designed radius of curvature, whereby the tip end of the resulting curved micro-spring is held away from the host substrate. The micro-spring package utilizes this structure to make contact between the host substrate (e.g., the IC die) and a corresponding package structure (e.g., the package base substrate) by mounting the IC die such that the tip ends of the micro-springs contact corresponding contact pads disposed on the corresponding package structure.

For high performance and high power IC's such as microprocessors, metal blocks combining with a bulky fan are attached directly to the backside (i.e., non-active surface) of chips disposed in a flip-chip arrangement for cooling purposes. Most of the heat (~80-90%) is conducted across the bulk of the chip, and then metal block, and finally dissipated through force convection by the fan. If avoid sticking a bulky fan on chip's back, the heat dissipation path needs to be engineered.

Driven by the trend of thinner, lighter and more and more functions in electronics products like cell phones and TVs, higher power density in semiconductor packaged devices is an unavoidable trend. Therefore, there is a need to manage the heat generated in the package in a more efficient and controllable way. Bulky fan is no longer an efficient way to manage the heat, especially the chips tends to be stacked horizontally as well as vertically (3D stacking). Passive methods like heat spread, underfill, and thermal interface materials, all of them are hard to be applied to chip stacking applications. Active cooling like micro fluidic channels can be used for 3D stacking, but fluid is not common in consumer electronics.

Ionic wind (or ion wind) is a dry process that may be used for IC cooling. Ionic wind works by applying high voltage between a high curvature (emitting) and a low curvature (collecting) electrodes. High electrical field around the emitting electrode ionizes the air molecules. The ions accelerated by electrical field and then transfer momentum to neutral air molecules through collisions. The resulting micro-scale ionic winds can potentially enhance the bulk cooling of forced convection at the location of a hot spot for more effective and efficient cooling. Various approaches have been developed that have been shown to generate ionic wind using, for example, wire based corona discharge. However, these approaches are difficult to implement using existing high volume IC fabrication and production methods.

What is needed is a practical, low cost method for generating ionic wind that can be implemented between circuit structures (e.g., a base substrate and an IC die) in a semiconductor circuit assembly (e.g., a flip-chip package) to cool the circuit structures.

SUMMARY OF THE INVENTION

The present invention is directed to a method for generating micro-plasma that involves applying a first (positive) voltage potential to the anchor portion of a micro-spring and a second (negative) voltage potential to an associated electrode, which is maintained a fixed gap distance from the spring's tip portion. By generating a sufficiently large voltage potential (i.e., as determined by Peek's Law, at least 100V, typically greater than 250V), current crowding at the tip portion of the micro-spring creates an electrical field that sufficiently ionizes neutral molecules in a portion of the air-filled region surrounding the tip portion to generate a micro-plasma event. An advantage of this method is that micro-plasma is reliably produced using very inexpensive methods that can be incorporated, for example, into IC devices to provide cooling.

According to an embodiment of the present invention, the method involves applying a positive voltage to the anchor portion of a micro-spring that is attached to and disposed parallel to a flat surface on a base substrate, whereby current travels up a curved body portion of the micro-spring to the tip portion, is fixedly disposed in an air-filled region located above the flat surface adjacent to the electrode. The anchor portion, body portion and tip portion comprise a highly electrically conductive material (e.g., gold over a base spring metal) to facilitate current conduction that generates sufficient current crowding to produce the micro-plasma event.

The present invention is also directed to a method for generating an ionic wind air current using the micro-plasma generating method (i.e., using curved micro-springs and associated electrodes that are disposed between circuit structures, such as a base substrate and an IC die). The method involves providing multiple spaced-apart ionic wind engine units, and controlling the units to generate micro-plasma events in a predetermined pattern and timing sequence such that a pressure differential produced by the multiple micro-plasma events generates the desired ionic wind air current that flows over and around the micro-springs.

According to another embodiment, the present invention is directed to a method for cooling a circuit assembly by generating an ionic wind air current that travels through or over the circuit assembly in a way that removes heat generated during operation. The method involves generating an ionic wind air current in the manner described above using multiple spaced-apart ionic wind engine units that are disposed, for example, between two substrates in a flip-chip or multi-level packaging arrangement, where the air current is either transmitted horizontally between the chips or vertically through openings defined through the chip layers. Because the micro-springs utilized to generate the ionic wind air currents are fabricated by existing high volume IC fabrication and production methods, and because such micro-springs can be implemented in the narrow gap between adjacent substrates in flip-chip and multi-level packaging arrangements, the present invention provides a very low cost approach for providing ionic wind-based cooling in a wide variety of semiconductor package assemblies and system-level semiconductor circuit assemblies.

BRIEF DESCRIPTION OF THE DRAWINGS

These and other features, aspects and advantages of the present invention will become better understood with regard to the following description, appended claims, and accompanying drawings, where:

FIG. 3 is a cross-sectional side view showing a system for generating a micro-plasma according to another specific embodiment of the present invention;

FIGS. 4(A) and 4(B) are simplified partial diagrams showing multi-directional micro-plasma generation generated by the system shown in FIG. 3;

DETAILED DESCRIPTION OF THE DRAWINGS

The present invention relates to an improvement in semiconductor packaging and other semiconductor circuit assemblies. The following description is presented to enable one of ordinary skill in the art to make and use the invention as provided in the context of a particular application and its requirements. As used herein, directional terms such as "upper", "upwards", "above", "vertical", "lower", "downward", "below" "front", "rear" and "side" are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. In an electrical connection sense, the term "connected" and phrase "electrically connected" are used to describe a direct connection between two circuit elements, for example, by way of a metal line formed in accordance with normal integrated circuit fabrication techniques, and the term "coupled" is used to describe either a direct connection or an indirect connection between two circuit elements. For example, two "coupled" elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
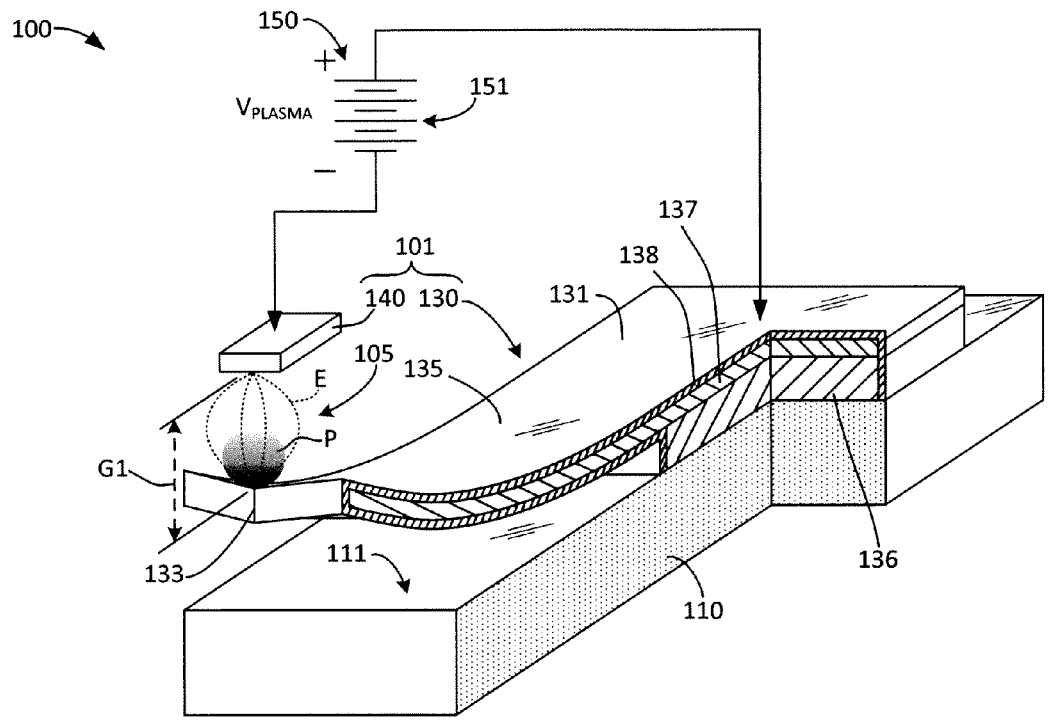
FIG. 1 is a perspective view showing a generalized system for generating a micro-plasma according to a first embodiment of the present invention.

FIG. 1 shows an ionic wind generating system 100 according to a generalized embodiment of the present invention including an ionic wind engine unit 101 and a voltage supply 150 including a battery 151 or other mechanism for providing a plasma generating voltage $V_{PLASMA}$ to unit 101.

According to an aspect of the present invention, curved micro-spring 130 includes an anchor portion 131 attached to and disposed parallel to a flat upper surface 111 of a base substrate 110, a curved body portion 135 having a first end integrally connected to anchor portion 131 and curved away from flat surface 111, and a tip portion 133 integrally connected to a free (second) end of curved body portion 135. All of anchor portion 131, body portion 135 and tip portion 133 include an electrically conductive material (e.g., a gold layer 138 disposed over a "core" spring metal layer 137). Note that, due to the characteristic upward-bending curve of micro-spring 130, tip portion 133 is fixedly disposed and maintained in an air-filled region 105 located above (i.e., spaced from) flat upper surface 111).

According to another aspect of the present invention, micro-spring 130 is formed on upper surface 111 using any of several possible processes. In one embodiment, micro-spring 130 is formed using a self-bending spring metal 137 that is deposited as a stress-engineered film and is then patterned to form spring material islands (flat structures) in which its lowermost portions (i.e., the deposited material adjacent to surface 111) has a lower internal tensile stress than its upper portions (i.e., the horizontal layers located furthest from surface 111), thereby causing the stress-engineered metal film to have internal stress variations that cause a narrow "finger" portion of the spring metal island to bend upward away from substrate 110 during the subsequent release process. Methods for generating such internal stress variations in stress-engineered metal films are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, a titanium (Ti) release material layer is deposited on surface 111, then a stress-engineered metal film includes one or more of molybdenum (Mo), a "moly-chrome" alloy (MoCr), tungsten (W), a titanium-tungsten alloy (Ti:W), chromium (Cr), copper (Cu), nickel (Ni) and a nickel-zirconium alloy (NiZr) are either sputter deposited or plated over the release material. An optional passivation metal layer (not shown; e.g., gold (Au), platinum (Pt), palladium (Pd), or rhodium (Rh)) may be deposited on the upper surface of the stress-engineered metal film to act as a seed material for the subsequent plating process if the stress-engineered metal film does not serve as a good base metal. The passivation metal layer may also be provided to improve contact resistance in the completed spring structure. In an alternative embodiment, a nickel (Ni), copper (Cu) or nickel-zirconium (NiZr) film may be formed that can be directly plated without a seed layer. If electroless plating is used, the deposition of the electrode layer can be skipped. In yet another alternative embodiment, the self-bending spring material may be one or more of a bimorph/ bimetallic compound (e.g., metal1/metal2, silicon/metal, silicon oxide/metal, silicon/silicon nitride) that are fabricated according to known techniques. In each instance an outer layer of highly conductive material (e.g., gold) is formed on the "base" spring metal material to increase conductivity and to facilitate micro-plasma generation. In yet another embodiment depicted in FIG. 1, micro-spring 130 is fabricated such that anchor portion 131 is connected to substrate 110 by way of an optional support structure 136 (e.g., a retained portion of the release layer or a pre-formed conductive base structure).

Referring again to FIG. 1, electrode 140 is an electrically conductive (e.g., gold or other metal) structure disposed on flat surface 111 or maintained above surface 111 by a support structure (not shown) such that such that tip portion 133 is maintained at a fixed gap distance G1 from electrode 140. During operation, system voltage supply 150 applies a positive (or negative) voltage potential to anchor portion 131 of micro-spring 130 and a negative (or positive) voltage potential to electrode 140. By generating a sufficiently large plasma-generating voltage $V_{PLASMA}$ (i.e., as determined by Peek's Law, at least 100V in practical applications, typically greater than 250V), current crowding at tip portion 133 of micro-spring 130 creates an electrical field E that sufficiently ionizes neutral molecules in a portion of air-filled region 105 surrounding tip portion 133 to generate a micro-plasma event P. This micro-plasma event is utilized as set forth below to generate an air current that is useful for cooling circuit structures on which ionic wind engine unit 101 is fabricated.

Various exemplary alternatives to the configuration of generalized ionic wind generating system 100 (e.g., involving activation of multiple ionic wind engine units), along with exemplary alternative structures and modifications utilized to implement electrode 140 are presented below in reference to alternative specific embodiments of the present invention. By providing multiple spaced-apart ionic wind engine units in a predetermined pattern, and by controlling the units to produce spaced-apart micro-plasma events, air currents are generated that can be used to cool the circuit structures on which the ionic wind engine units are fabricated. Moreover, because micro-springs 130 utilized by the present invention are fabricated by existing high volume IC fabrication and production methods, and because such micro-springs can be implemented in the narrow gap between adjacent substrates in a flip-chip package, the present invention provides a very low cost approach for providing ionic wind-based cooling in a wide variety of semiconductor package assemblies and system-level semiconductor circuit assemblies.

Figure 2:
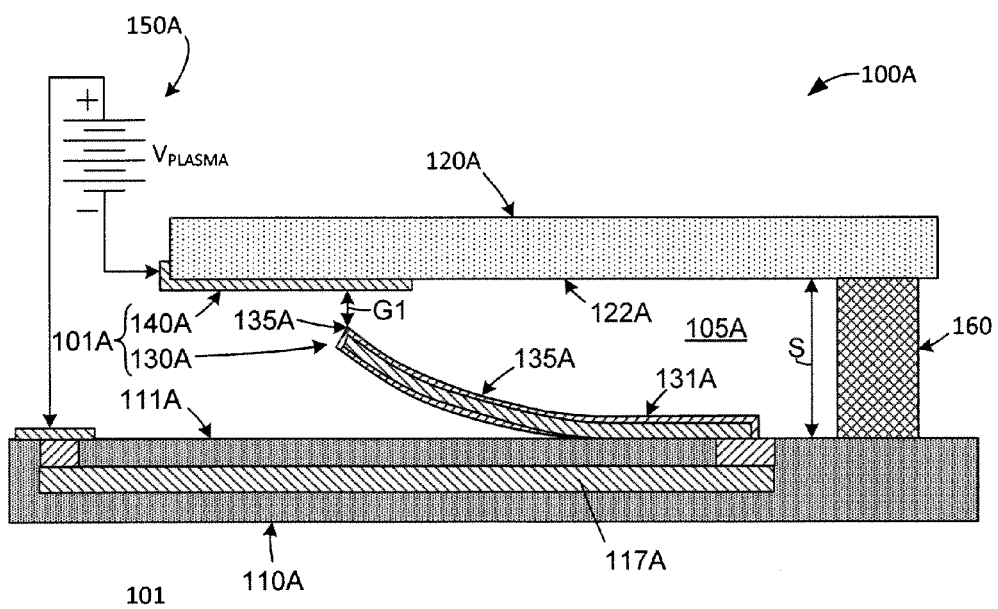
FIG. 2 is a cross-sectional side view showing a system for generating a micro-plasma according to a specific embodiment of the present invention.

FIG. 2 is a cross-sectional side view showing a system 100A according to first specific embodiment in which ionic wind engine element 101A is implemented by a curved micro-spring 130A and an electrode 140A that are disposed in an air-filled channel region 105A disposed between two parallel base and secondary substrates 110A and 120A (e.g., such as in a flip-chip semiconductor package arrangement). In this embodiment, micro-spring 130A has an anchor portion 131A attached to upper surface 111A, curved body portion 135A extending away from upper surface 111A, and a tip portion 133A disposed at a free end of body portion 135A. In addition, electrode 140A is formed by a metal pad or plate disposed on lower (downward facing) surface 122A of the secondary substrate 120A. A suitable stand-off structure 160 (e.g., an polyimide pedestal or metal shim) is provided between substrates 110A and 120A to maintain a fixed spacing S between surfaces 111A and 122A, whereby tip portion 133A is maintained at fixed gap distance G1 from electrode 140A. System 100A also includes a voltage supply 150A having a negative terminal that coupled to electrode 140A, and a positive terminal that is coupled to anchor portion 131A of micro-spring 130A by way of a conductor 117A disposed in base substrate 110A, thereby generating plasma-generating voltage $V_{PLASMA}$ across fixed gap distance G1 between tip portion 133A of the micro-spring 130A and electrode 140A.

FIG. 3 shows a system 100B according to an alternative embodiment in which ionic wind engine unit 101B includes a single curved micro-spring 130B that is attached to a base substrate 110B and a (first) electrode 140B-1 that is disposed on lower surface 122B of secondary substrate 120B, and maintained at a first fixed gap distance G11 from the tip portion 133B of the curved micro-spring 130B, as described above with reference to FIG. 2. System 100B differs from system 100A in that unit 101B also includes one or more additional electrodes (e.g., electrode 140B-2) disposed on lower surface 122B of secondary substrate 120B, where (second) electrode 140B-2 is adjacent to but spaced from (first) electrode 140B-1, and is maintained at a second fixed gap distance G12 from the tip portion 133B of the curved micro-spring 130B. In addition, system 100B differs from system 100A in that voltage supply 150B includes a suitable mechanism (e.g., switch 155B) for applying plasma-generating voltage $V_{PLASMA}$ either across (first) fixed gap distance G11 between tip portion 133B of micro-spring 130B and the first electrode 140B-1, or across (second) fixed gap distance G12 between tip portion 133B and the second electrode 140B-2. As shown in FIG. 4(A), during a first time period t1 when plasma-generating voltage $V_{PLASMA}$ is applied across (first) fixed gap distance G11, a first micro-plasma event P-B1 is generated between micro-spring 130B and first electrode 140B-1 having a first nominal "glowing" direction angle θ1, where angle θ1 is generally defined by the straight line distance between tip portion 133A and electrode 140B-1. Alternatively, as shown in FIG. 4(B), during a second time period t2 when plasma-generating voltage $V_{PLASMA}$ is applied across (second) fixed gap distance G12, a second micro-plasma P-B2 is generated between said micro-spring 130B and said second electrode 140B-2 having a second glowing direction angle θ2 during the second time period t2. By positioning the two electrodes 140B-1 and 140B-2 in a predetermined pattern, micro-plasma events P-B1 and P-B2 are generated in two different directions at two different times, whereby these micro-plasma events may be utilized to generate an air current C in air-filled channel region 105B that may be used to cool electronic devices disposed on substrates 110B or 120B.

Figure 5:
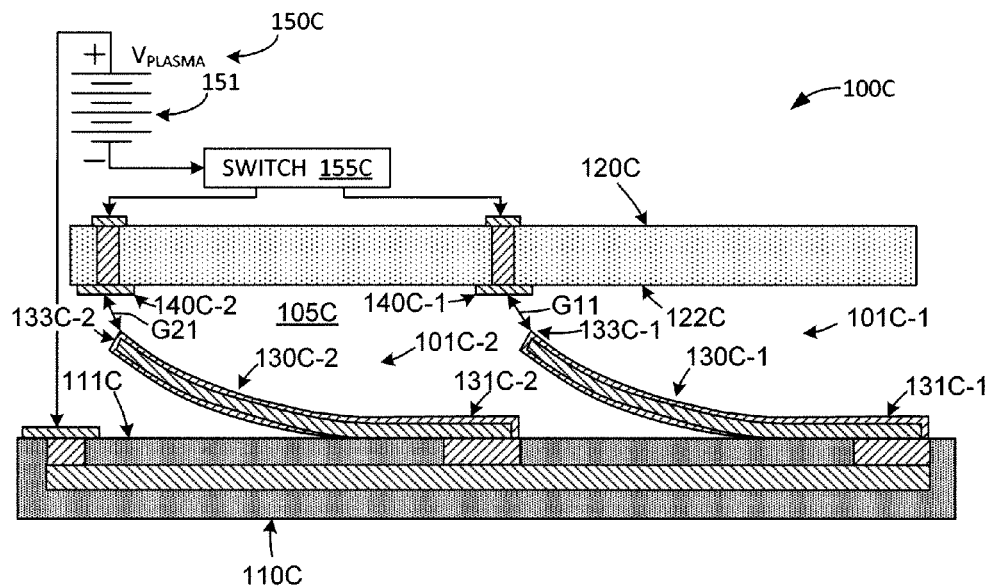
FIG. 5 is a cross-sectional side view showing an exemplary circuit assembly according to another specific embodiment of the present invention.

FIG. 5 shows a system 100C according to another alternative specific embodiment including two ionic wind engine units 1010-1 and 1010-2 are provided in an air-filled channel region 105C between a base substrate 110C and a secondary substrate 120C. Unit 101C-1 includes a (first) curved micro-spring 130C-1 having an anchor portion 131C-1 that is attached to upper surface 111C of base unit 110C, and a (first) electrode 140C-1 that is disposed on lower surface 122C of secondary substrate 120C and maintained at a fixed gap distance G11 from tip portion 133C-1 of micro-spring 130C-1, in the manner described above with reference to FIG. 2. Similarly, unit 101C-2 includes a (second) curved micro-spring 130C-2 having an anchor portion 131C-2 attached to upper surface 111C, and a (second) electrode 140C-2 that is disposed on lower surface 122C and maintained at a fixed gap distance G21 from tip portion 133C-2, also in the manner described above with reference to FIG. 2. As indicated in the upper portion of FIG. 5, voltage supply 150C of system 100C also includes a switch 155C that alternatively couples the negative electrode of battery 151 to electrodes 140C-1 and 140C-2.

Figure 6A:
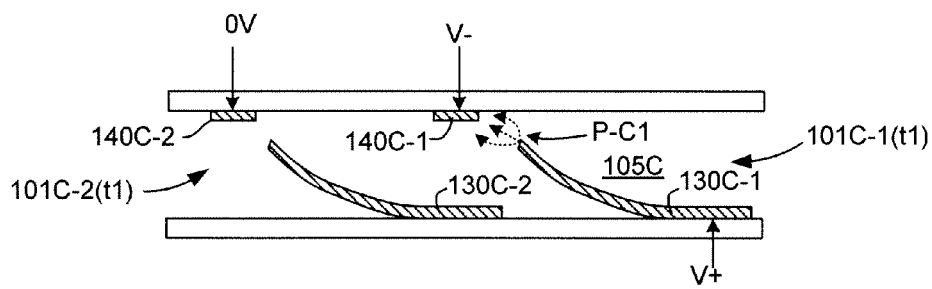
FIGS. 6(A) and 6(B) are simplified cross-sectional side views showing the system of FIG. 5 during an operation to generate ionic wind according to an aspect of the present invention.
Figure 6B:
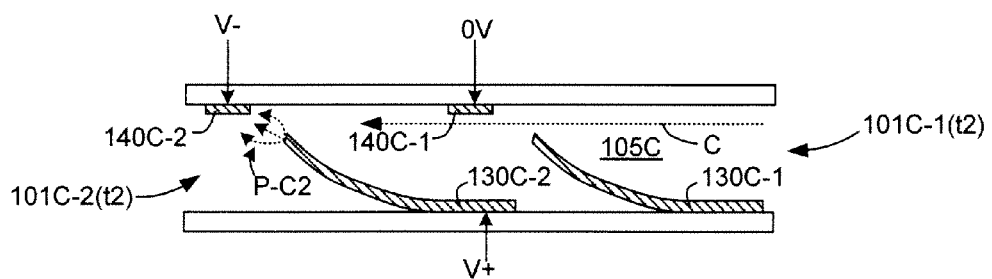

FIGS. 6(A) and 6(B) illustrate a simplified method for generating an ionic wind air current utilizing system 100C according to another embodiment of the present invention. As indicated in FIG. 6(A), during a first time period t1, unit 101C-1 is activated when switch 155C is actuated such that positive voltage V+ is applied to the anchor portion of (first) micro-spring 130C-1 and negative voltage V− is applied to (first) electrode 140C-1, whereby plasma-generating voltage $V_{PLASMA}$ is applied across the gap between micro-spring 130C-1 and electrode 140C-1 (unit 101C-2 is de-activated at this time) in the manner described above to generate a first micro-plasma event P-C1 in the right-center region of air-filled channel region 105C. As indicated in FIG. 6(B), during a second time period t2, unit 101C-2 is activated when the switch applies positive voltage V+ to the anchor portion of (second) micro-spring 130C-2 and negative voltage V− is applied to (second) electrode 140C-2, whereby plasma-generating voltage $V_{PLASMA}$ is produced across the gap between tip portion 133C-2 and electrode 140C-2 (unit 101C-1 is de-activated during time period t2) in the manner described above such that a second micro-plasma event P-C2 is generated in the left portion of air-filled channel region 105C. By positioning unit 101C-1 adjacent to unit 101C-2, and by alternating the activation of units 101C-1 and 101C-2 in a closely timed manner, micro-plasma events P-C1 and P-C2 produce a pressure differential that creates air movement in a direction from micro-spring 130C-1 to micro-spring 130C-2, thereby producing an air current C in the air-filled gap region 105C. By mounting units 101C-1 and 101C-2 on a circuit assembly (e.g., between a substrate and an IC in a flip-chip package arrangement), ionic wind air current C can be utilized to cool the circuit assembly in a highly efficient manner.

Figure 7:
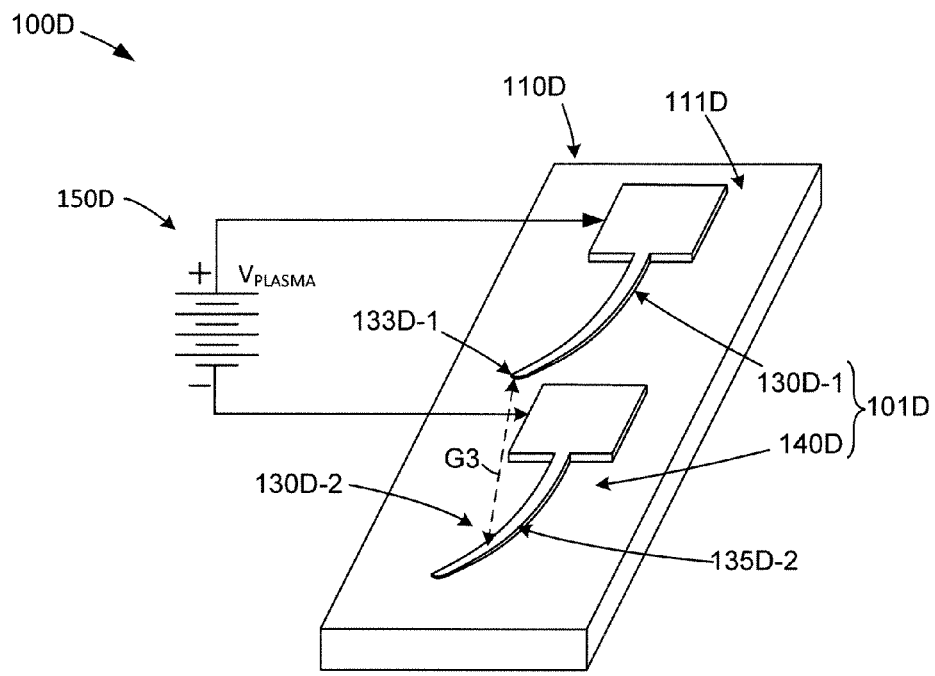
FIG. 7 is a perspective view showing a system for generating a micro-plasma according to another specific embodiment of the present invention.
Figure 8:
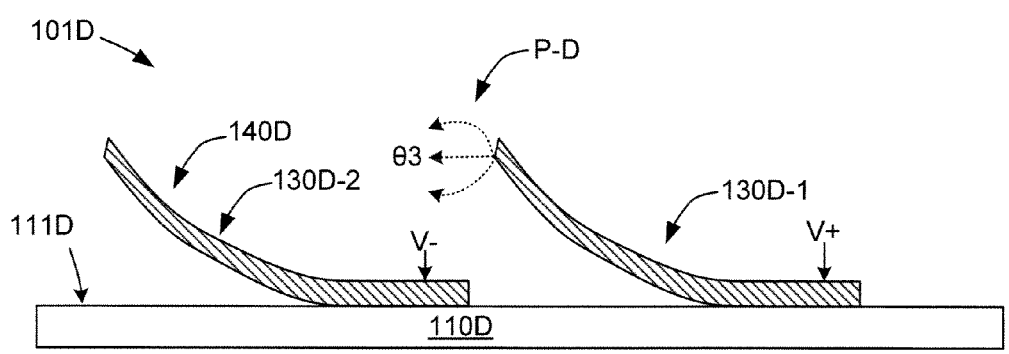
FIG. 8 is a cross-sectional side view showing the system of FIG. 7 during operation.

FIG. 7 is perspective view showing a system 100D including a voltage supply 150D and a basic ionic wind engine unit 101D according to another embodiment of the present invention. Similar to the spring/pad embodiment describe above, unit 101D includes an "anode" micro-spring 130D-1 that is formed on flat (upper) surface 111D of base substrate 110D in accordance with the details set forth above. However, in this case, electrode 140D of unit 101D is implemented by a second curved "cathode" micro-spring 130D-2 disposed on flat surface 111D adjacent to "anode" curved micro-spring 130D-1 such a fixed gap distance G3 is defined between (first) tip portion 133D-1 and a (second) body portion 135D-2 of "cathode" micro-spring 130D-2. As also indicated in FIGS. 7 and 8, voltage supply 150D applies plasma-generating voltage $V_{PLASMA}$ across the fixed gap distance G3 between micro-springs 130D-1 and 130D-2 such that, as indicated in FIG. 8, micro-plasma P-D is produced at a nominal direction angle θ3 that is substantially parallel to flat surface 111D of base substrate 110D (i.e., substantially horizontally with a slight downward bias toward base substrate 110D). That is, because the ionized region generated between tip 133D-1 and body 135D-2 is directed slightly downward, unit 101D produces a micro-plasma event P-D that is more horizontally oriented than that of the first specific embodiment described above.

Figure 9A:
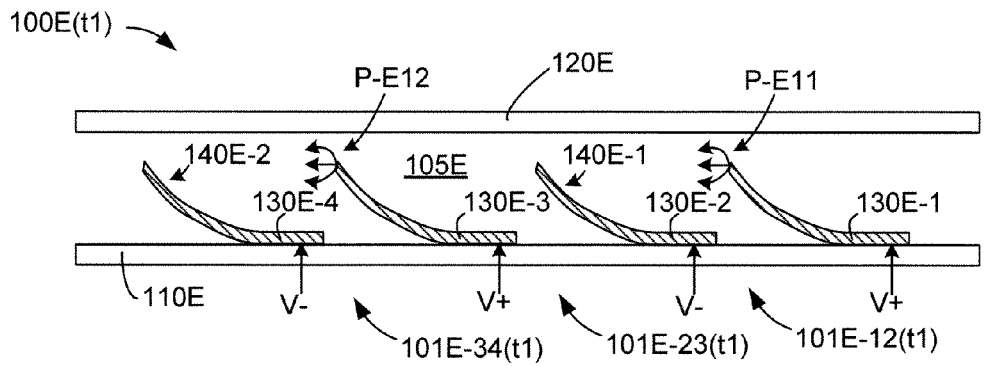
FIGS. 9(A), 9(B) and 9(C) are simplified cross-sectional side views showing a system for generating ionic wind according to another embodiment of the present invention.
Figure 9B:
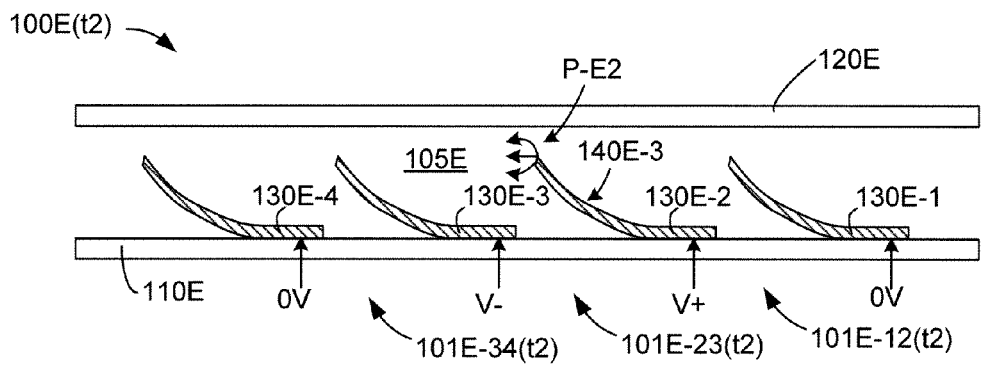
Figure 9C:
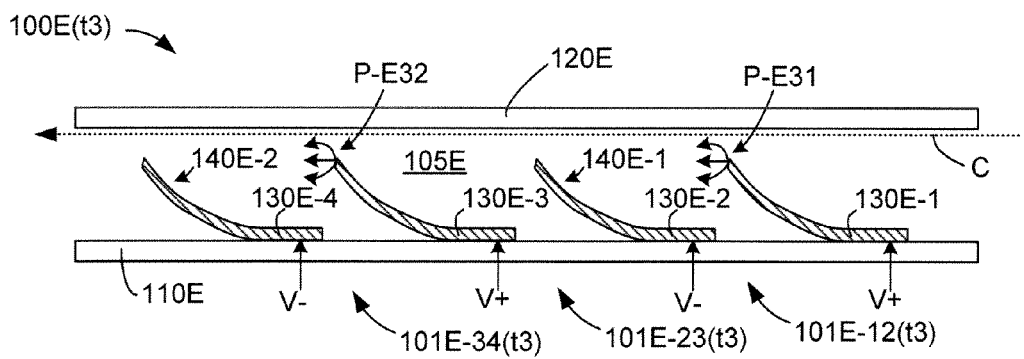

FIGS. 9(A) to 9(C) are simplified perspective views showing a system 100E including an ionic wind engine produced by multiple units 101E-11 to 101E-34 formed by micro-springs 130E-1 to 130E-4 disposed in an air-gap channel region 105E defined between parallel substrates 110E and 120E according to another specific embodiment of the present invention. Each unit 101E-12 to 101E-34 is formed by two adjacent micro-springs arranged in series in a manner similar to that described above with reference to FIGS. 7 and 8. Specifically, unit 101E-12 is formed by micro-spring 130E-1 and micro-spring 130E-2, unit 101E-23 is formed by micro-spring 130E-2 and micro-spring 130E-3, and unit 101E-34 is formed by micro-spring 130E-3 and micro-spring 130E-4. Note that micro-springs 130E-2 and 130E-3 serve as both anodes and cathodes in this specific embodiment, with micro-spring 130E-2 serving as a cathode in unit 101E-12 and an anode in unit 101E-23, and with micro-spring 130E-3 serving as an anode in unit 101E-23 and a cathode in unit 101E-34.

FIGS. 9(A) to 9(C) also illustrate a simplified method for generating an ionic wind air current utilizing system 100E according to another embodiment of the present invention. As indicated in FIG. 9(A), the system voltage supply (not shown) utilizes a suitable switch network that activates units 101E-12 and 101E-34 by applying the plasma-generating voltage across micro-springs 130E-1 and 130E-2 during a first time period t1 (i.e., positive voltage V+ to (first) micro-spring 130E-1 and negative voltage V− to micro-spring 130E-2/first electrode 140E-1) such that a (first) micro-plasma event P-E11 is generated between micro-springs 130E-1 and 130E-2 during the first time period t1. At the same time, the system voltage supply applies positive voltage V+ to micro-spring 130E-3 and negative voltage V− to micro-spring 130E-4 such that an additional micro-plasma event P-E12 is generated between micro-springs 130E-3 and 130E-4 (electrode 140E-2) during the first time period t1. Subsequently, as indicated in FIG. 9(B), during time period t2, the voltage supply of system 100E applies positive voltage V+ to (second) micro-spring 130E-2 and negative voltage V− to micro-spring 130E-3 (second electrode 140E-3) such that a (second) micro-plasma P-E2 is generated between micro-springs 130E-2 and 130E-3 during the second time period t2. As indicated in FIG. 9(C), during a subsequent time period t3, positive voltage V+ is applied to micro-springs 130E-1 and 130E-3, and negative voltage V− is applied to micro-springs 130E-2 and 130E-4, thereby generating further micro-plasma events P-E31 and P-E32. By activating micro-springs/electrodes 130E-1 to 130E-4 in the depicted sequence to generate this micro-plasma event generation pattern, the ionic wind engine of system 100E produces pressure differentials that create air movement between micro-spring 130E-1 and micro-spring 130E-4, thereby generating an air current C in air-gap channel region 105E between substrates 110E and 120E. Further, by mounting micro-springs 130E-1 to 130E-4 on a circuit assembly (e.g., between a substrate and an IC in a flip-chip package arrangement), air current C can be utilized to cool the circuit assembly in a highly efficient manner.

Figure 10:
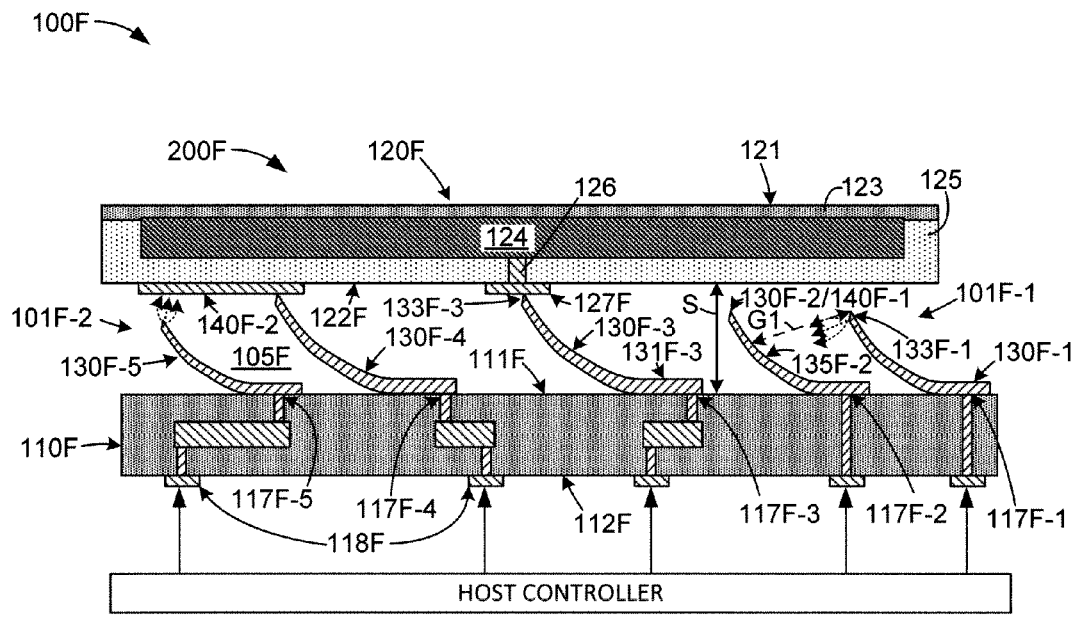
FIG. 10 is a cross-sectional side view showing a circuit assembly and associated system according to another specific embodiment of the present invention.

FIG. 10 is a simplified cross-sectional view showing a flip-chip package (circuit assembly) 200F according to another embodiment of the present invention including a package base substrate (first substrate) 110F and an IC die (second substrate) disposed in a face-to-face arrangement and separated by a distance S defining an air-filled gap region 110F. Base substrate 110F has an upper surface 111F including several upper (first) contact pads 117F-1 to 117F-5 and a bottom surface 112F having several associated contact pads 118F and intervening conductive structures, and is constructed of a suitable base substrate material (e.g., sapphire, ceramic, glass, or organic printed circuit board material). IC die 120F is a semiconductor device including an integrated circuit 124 formed on one surface of a semiconductor (e.g., silicon) "chip" 123 using any known semiconductor fabrication technique (e.g., CMOS), a passivation layer 125 formed over integrated circuit 124, and metal interconnect structures (e.g., metal via 126) extending through passivation layer 125 to contact pads 127F disposed on a lower (i.e., "active") surface of IC die 120F. The opposing upper "non-active" surface 121 of IC die 120F is unprocessed.

According to an aspect of the present embodiment, flip-chip package 200F includes micro-springs utilized for both interconnect and ionic wind cooling (i.e., air current generation). That is, flip-chip package 200F includes at least one curved interconnect micro-spring disposed in air-filled channel region 105F that is electrically connected at opposing ends electrically couple base substrate 110F to integrated circuit 124, and at least one micro-spring that is disposed in air-filled channel region 105F and operably connected in a manner that forms one of the ionic wind engine units described above.

Referring to the middle of FIG. 10, the interconnect function of flip-chip package 200F is illustrated by micro-spring 130E-3, which includes an anchor (first) end portion 131F-3 that is attached to upper surface 111F and electrically connected to contact pad 117F-3, a tip (second) end portion 133F-3 that is in nonattached contact with contact pad 127F, and a curved body portion extending between the two ends through air-filled gap region 105F. A large number of interconnect micro-springs connected in the manner indicated by micro-spring 130E-3 are typically utilized to facilitate communications between a host controller and integrated circuit 124 by way of contact pads 118F.

In addition, flip-chip package 200F includes one or both of ionic wind engine units 101F-1 and 101F-2 formed in the manner described above. Specifically, unit 101F-1 includes an anode micro-spring 130-$F_1$ attached to upper surface 111F and an electrode structure 140E-1 formed by a "cathode" (second) curved micro-spring 130E-2 attached to upper surface 111F adjacent to said anode micro-spring 130E-1 such the fixed gap distance G1 is defined between tip portion 133F-1 of anode micro-spring 130E-1 and body portion 135F-2 of "cathode" micro-spring 130E-2, whereby an appropriate voltage applied across gap G1 generates a micro-plasma event in the manner described above. Alternatively, unit 101F-2 includes an anode micro-spring 130-$F_5$ attached to upper surface 111F and an electrode structure 140E-2 formed by a metal contact pad disposed on lower surface 122F of IC die 120F, whereby an appropriate voltage applied between micro-spring 130E-5 and electrode structure 140E-2 generates another micro-plasma event between the tip portion of micro-spring 130E-5 and electrode structure 140E-2 in the manner described above. In alternative embodiments, flip-chip package 200F may include an ionic wind engine consisting only of multiple wind engine units of the type depicted by unit 101F-1, consisting only of multiple wind engine units of the type depicted by unit 101F-2, or consisting multiple wind engine units including a combination of the different types of units depicted by units 101F-1 and 101F-2.

The embodiment shown in FIG. 10 is particularly beneficial in circuit assemblies that already implement micro-springs for interconnect purposes (e.g., interconnect micro-spring 130E-3) because the micro-springs utilized for interconnection and the micro-springs utilized to implement the ionic wind engine of the present invention are economically produced during the same fabrication processes. That is, the same stressy-metal film deposition, patterning, and release processes utilized to produce interconnect micro-spring 130E-3 are utilized to simultaneously produce ionic wind engine micro-springs 130E-1, 130E-2 and 130E-5. As such, the implementation of ionic wind engine units 101F-1 and 101F-2 on flip-chip package 200F is provided at essentially no additional production cost.

As described above, each micro-spring is an etched structure that attaches on one end to a carrier device (e.g., package base substrate 110F in FIG. 10), and either serves as an interconnect structure to pass voltages or signals to a mating device (e.g., as in the case of spring 130E-3 in FIG. 10), or has a tip that is disposed in the air gap region and serves to generate a micro-plasma in conjunction with an associated electrode (e.g., as in the case of springs 130E-1, 130E-2 and 130E-5 in FIG. 10). In alternative embodiments the role of host substrate for the micro-springs is performed, for example, by the IC die in a flip-chip arrangement. For example, in an alternative embodiment at least one micro-spring is fabricated on and extends from active surface 122F of IC device 120F (i.e., instead of on package base substrate 110F). Thus, unless otherwise specified in the appended claims, the micro-springs are understood to be formed on either of the two substrates in a flip-chip arrangement. In addition, although the structure show in FIG. 10 suggests that the host controller controls application of the plasma generating voltages, control logic for this purpose may be easily implemented in IC die 120F and passed to package substrate 110F.

Figures 11A, 11B:
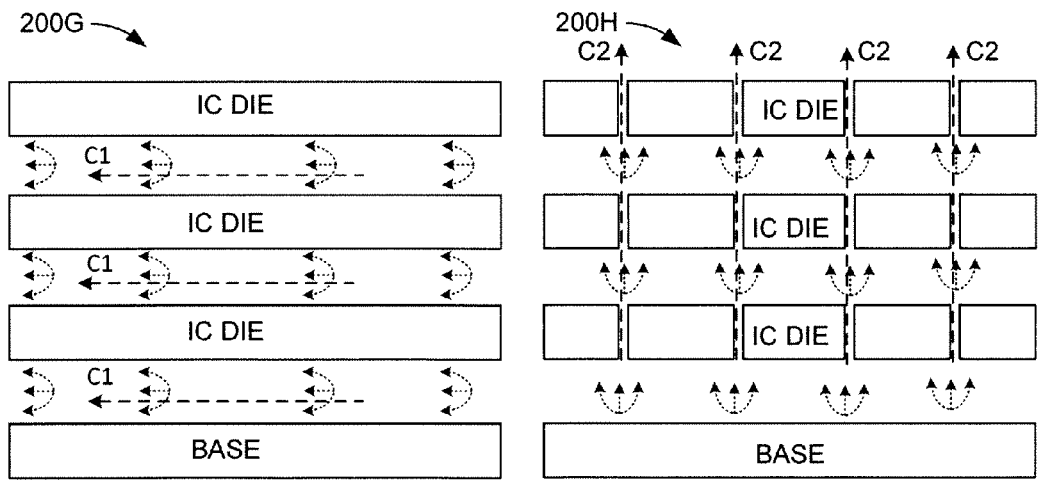
FIGS. 11(A) and 11(B) are simplified diagrams showing multi-level chip assemblies implementing air cooling engines in accordance with additional alternative specific embodiments of the present invention.

Although the present invention has been described with respect to certain specific embodiments, it will be clear to those skilled in the art that the inventive features of the present invention are applicable to other embodiments as well, all of which are intended to fall within the scope of the present invention. For example, although the invention of FIG. 10 is described with specific reference to a basic flip-chip semiconductor package-type structure, ionic wind engines described herein may be provided to generate ionic wind in each gap separating multiple IC dies (substrates) in a multi-level packaging arrangement (e.g., as depicted by multi-level packaging arrangement 200G in FIG. 11(A)), or to generate cooling air currents between other types of circuit substrates (e.g., between packaged IC devices and large PCBs in system-level settings). Further, as indicated by multi-level packaging arrangement 200H in FIG. 11(B), the micro-plasma generating units of the present invention may be positioned to generate "vertical" air currents through openings formed in stacked IC die. Moreover, although operation of the ionic wind engines of the present invention is described primarily with reference to direct current voltage potentials, in some embodiments (e.g., in the arrangement described with reference to FIGS. 9(A) to 9(C)), it may be advantageous to utilized an alternating current to avoid charge buildup.

The invention claimed is:

1. A method for generating a micro-plasma, comprising applying a first voltage potential to a micro-spring while applying a second voltage potential to an electrode disposed adjacent to a tip portion of the micro-spring, the first and second voltage potentials being sufficient to cause current crowding at the tip portion, thereby creating an electrical field that sufficiently ionizes neutral molecules in a portion of the air-filled region surrounding the tip portion to generate a micro-plasma event.

2. The method of claim 1, wherein applying said first and second voltage potentials comprises generating a plasma-generating voltage of 250V or greater between said tip portion and said electrode.

3. The method of claim 1,
wherein the micro-spring includes an anchor portion disposed parallel to a base surface on a base substrate, a curved body portion having a first end integrally connected to the anchor portion and curved away from the base surface, and said tip portion integrally connected to a second end of the curved body portion, the anchor, body and tip portions comprising an electrically conductive material, wherein the tip portion is fixedly disposed in said air-filled region located above the base surface,
wherein the electrode is disposed on or above the surface adjacent to the tip portion of the micro-spring such that the tip portion is maintained at a fixed gap distance from the electrode, and
wherein applying said first voltage potential comprises coupling a voltage supply to the anchor portion of the micro-spring such that current travels between said anchor portion and said tip portion.

4. The method of claim 3, wherein the electrode is disposed on a second substrate fixedly disposed over the base substrate, and wherein generating said micro-plasma comprises generating said micro-plasma event in an air-filled channel defined between the base substrate and the second substrate.

5. The method of claim 4, wherein the second substrate includes a second electrode disposed adjacent to and spaced from the electrode and maintained at a second fixed gap distance from the tip portion of the micro-spring, and
wherein generating said micro-plasma comprises:
generating a first micro-plasma event between the tip portion of the micro-spring and the electrode during a first time period such that said first micro-plasma event includes micro-plasma having has a first glowing direction during the first time period; and
generating a second micro-plasma event between the tip portion of the micro-spring and the second electrode during a second time period such that said second micro-plasma event has a first glowing direction during the second time period, the second glowing direction being different from the first glowing direction.

6. The method of claim 4, further comprising applying a third voltage potential to of a second micro-spring disposed on the base substrate while applying a fourth voltage potential to a second electrode disposed on the second substrate adjacent to a tip portion of the second micro-spring, the third and fourth voltage potentials being sufficient to generate a second micro-plasma event that is spaced from the first micro-plasma event.

7. The method of claim 3,
wherein the electrode comprises a second micro-spring attached to the base surface of the base substrate adjacent to said micro-spring such the fixed gap distance is defined between said tip portion and a second body portion of said second micro-spring; and
wherein applying said second voltage potential comprises coupling a second voltage supply to the anchor portion of the second micro-spring.

8. A method for generating a ionic wind air current, the method comprising:

applying a first voltage potential to the anchor portion of a first micro-spring while applying a second voltage potential to a first electrode disposed adjacent to a tip portion of the first micro-spring, the first and second voltage potentials being sufficient to cause current crowding at the tip portion of the first micro-spring, thereby creating a first electrical field that sufficiently ionizes neutral molecules in a first portion of the air-filled region surrounding the tip portion to generate a first micro-plasma event; and
applying a third voltage potential to the anchor portion of a second micro-spring disposed adjacent to the first micro-spring while applying a fourth voltage potential to a second electrode disposed adjacent to a tip portion of the second micro-spring, the first and second voltage potentials being sufficient to cause current crowding at the tip portion of the second micro-spring, thereby creating a second electrical field that sufficiently ionizes neutral molecules in a second portion of the air-filled region surrounding the tip portion to generate a second micro-plasma event,
wherein a time period between the first micro-plasma event and the second micro-plasma event is set such that a pressure differential produced by the first and second micro-plasma events generates said ionic wind air current between said first and second micro-springs.

9. The method of claim 8, wherein applying said first and second voltage potentials comprises generating a plasma-generating voltage of 250V or greater between said tip portion of the first micro-spring and said first electrode.

10. The method of claim 8,
wherein each of the first and second micro-springs includes an anchor portion disposed parallel to a base surface on a base substrate, a curved body portion having a first end integrally connected to the anchor portion and curved away from the base surface, and said tip portion integrally connected to a second end of the curved body portion, the anchor, body and tip portions comprising an electrically conductive material, wherein the tip portion is fixedly disposed in said air-filled region located above the base surface,
wherein each of the first and second electrodes is disposed on or above the surface adjacent to the tip portions of the first and second micro-springs, respectively, and
wherein applying said first and third voltage potentials comprises separately coupling a voltage supply to the anchor portion of the first and second micro-springs such that current travels between said anchor portion and said tip portion of the first micro-spring during a first time period, and such that current travels between said anchor portion and said tip portion of the second micro-spring during a second time period.

11. The method of claim 9, wherein the first and second electrodes are disposed on a second substrate fixedly disposed over the base substrate, and wherein generating said micro-plasma comprises generating said first and second micro-plasma events in an air-filled channel defined between the base substrate and the second substrate.

12. The method of claim 9, wherein the first electrode and said second micro-spring comprise a single micro-spring such that generating said first micro-plasma event comprises applying said second voltage potential to an anchor portion of said single micro-spring during said first time period, and generating said second micro-plasma event comprises applying said third voltage potential to said anchor portion of said single micro-spring during said second time period.

13. A method for cooling a circuit assembly, the method comprising:
- applying a first voltage to the anchor portion of a first micro-spring mounted on the circuit assembly while applying a second voltage to a first electrode disposed adjacent to a tip portion on the circuit assembly of the first micro-spring, the first and second voltages being sufficient to cause current crowding at the tip portion of the first micro-spring, thereby creating a first electrical field that sufficiently ionizes neutral molecules in a first portion of the air-filled region surrounding the tip portion to generate a first micro-plasma event; and
- applying a second voltage to the anchor portion of a second micro-spring mounted on the circuit assembly and disposed adjacent to the first micro-spring while applying a second voltage to a second electrode disposed on the circuit assembly adjacent to a tip portion of the second micro-spring, the first and second voltages being sufficient to cause current crowding at the tip portion of the second micro-spring, thereby creating a second electrical field that sufficiently ionizes neutral molecules in a second portion of the air-filled region surrounding the tip portion to generate a second micro-plasma event.

14. The method of claim 13, wherein a time period between the first micro-plasma event and the second micro-plasma event is set such that a pressure differential produced by the first and second micro-plasma events generates said ionic wind air current between said first and second micro-springs.

15. The method of claim 14, wherein said first and second micro-springs are positioned such that said ionic wind air current is directed between first and second substrates.

16. The method of claim 14, wherein said first and second micro-springs are positioned such that said ionic wind air current is directed through openings formed in at least one of said first and second substrates.

17. The method of claim 13, wherein applying said first and second voltage potentials comprises generating a plasma-generating voltage of 250V or greater between said tip portion of the first micro-spring and said first electrode.

18. The method of claim 13,
- wherein each of the first and second micro-springs includes an anchor portion disposed parallel to a base surface on a base substrate, a curved body portion having a first end integrally connected to the anchor portion and curved away from the base surface, and said tip portion integrally connected to a second end of the curved body portion, the anchor, body and tip portions comprising an electrically conductive material, wherein the tip portion is fixedly disposed in said air-filled region located above the base surface,
- wherein each of the first and second electrodes is disposed on or above the surface adjacent to the tip portions of the first and second micro-springs, respectively, and
- wherein applying said first and third voltage potentials comprises separately coupling a voltage supply to the anchor portion of the first and second micro-springs such that current travels between said anchor portion and said tip portion of the first micro-spring during a first time period, and such that current travels between said anchor portion and said tip portion of the second micro-spring during a second time period.

19. The method of claim 18, wherein the first and second electrodes are disposed on a second substrate fixedly disposed over the base substrate, and wherein generating said micro-plasma comprises generating said first and second micro-plasma events in an air-filled channel defined between the base substrate and the second substrate.

20. The method of claim 18, wherein the first electrode and said second micro-spring comprise a single micro-spring such that generating said first micro-plasma event comprises applying said second voltage potential to an anchor portion of said single micro-spring during said first time period, and generating said second micro-plasma event comprises applying said third voltage potential to said anchor portion of said single micro-spring during said second time period.

* * * * *